(12) United States Patent
Ohnishi et al.

(10) Patent No.: US 9,046,768 B2
(45) Date of Patent: Jun. 2, 2015

(54) RESIST OVERLAYER FILM FORMING COMPOSITION FOR LITHOGRAPHY

(71) Applicant: NISSAN CHEMICAL INDUSTRIES, LTD., Tokyo (JP)

(72) Inventors: Ryuji Ohnishi, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/350,191

(22) PCT Filed: Sep. 26, 2012

(86) PCT No.: PCT/JP2012/074698
§ 371 (c)(1),
(2) Date: Apr. 7, 2014

(87) PCT Pub. No.: WO2013/051442
PCT Pub. Date: Apr. 11, 2013

(65) Prior Publication Data
US 2014/0255847 A1    Sep. 11, 2014

(30) Foreign Application Priority Data
Oct. 6, 2011   (JP) .................... 2011-222121

(51) Int. Cl.
G03F 7/26      (2006.01)
G03F 7/027     (2006.01)
G03F 7/11      (2006.01)

(52) U.S. Cl.
CPC .  *G03F 7/027* (2013.01); *G03F 7/11* (2013.01)

(58) Field of Classification Search
CPC ....... H01L 33/007; H01L 33/32; H01L 21/00; G03F 7/11; G03F 7/2041; G03F 7/095; G03F 7/016; G03F 7/027; G03F 7/38; G03F 7/093; C08K 5/18
USPC ............................................. 430/322, 270.1
See application file for complete search history.

(56) References Cited

U.S. PATENT DOCUMENTS

| 6,054,251 A | 4/2000 | Imai et al. |
| 2006/0127812 A1 | 6/2006 | Endo et al. |
| 2007/0298351 A1 | 12/2007 | Shimada et al. |

FOREIGN PATENT DOCUMENTS

| JP | A-01-133044 | 5/1989 |
| JP | A-09-062008 | 3/1997 |
| JP | A-10-010743 | 1/1998 |
| JP | A-10-104826 | 4/1998 |
| JP | A-2004-348133 | 12/2004 |
| JP | A-2005-292733 | 10/2005 |
| JP | A-2006-163250 | 6/2006 |
| JP | A-2008-044348 | 2/2008 |
| JP | A-2008-198788 | 8/2008 |

OTHER PUBLICATIONS

Nov. 13, 2012 International Search Report issued in International Application No. PCT/JP2012/074698.
Nov. 13, 2012 Written Opinion issued in International Application No. PCT/JP2012/074698.

*Primary Examiner* — Caleen Sullivan
(74) *Attorney, Agent, or Firm* — Oliff PLC

(57) ABSTRACT

A resist overlayer film composition for lithography from which a resist overlayer film is formed. A resist overlayer film forming composition including a benzene compound having at least one amino group. A resist may be an EUV resist or an electron beam resist. The benzene compound may have at least one amino group and at least one alkyl group, one or two amino groups and one to four alkyl groups, or may be a compound of Formula (1):

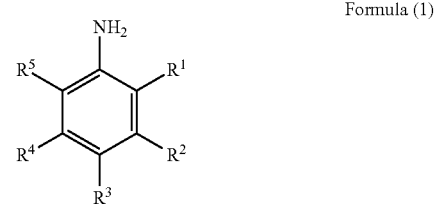

Formula (1)

where $R^1$ to $R^5$ are independently a hydrogen atom, a $C_{1-10}$ alkyl group such as methyl, ethyl or isopropyl, or an amino group.

11 Claims, No Drawings

RESIST OVERLAYER FILM FORMING COMPOSITION FOR LITHOGRAPHY

TECHNICAL FIELD

The present invention relates to a resist overlayer film composition for lithography, which is used in a device fabrication process using lithography, reduces adverse effects caused by exposure light, and is effective for obtaining a good resist pattern, and to a method for forming a resist pattern using the resist overlayer film composition for lithography.

BACKGROUND ART

Microfabrication using photolithography techniques has conventionally been performed in manufacturing of semiconductor devices. The microfabrication is a process of forming a thin film of a photoresist composition on a substrate to be processed such as a silicon wafer, irradiating the film with active light such as ultraviolet rays through a mask pattern having semiconductor device patterns, developing the pattern, and etching the substrate to be processed such as a silicon wafer using the resulting photoresist pattern as a protection film. With the increasing density of semiconductor devices in recent years, the active light used have been changed to those at shorter wavelengths from KrF excimer laser (248 nm) to ArF excimer laser (193 nm). Accordingly, the effects of diffuse reflection or standing waves of active light from the substrate become a serious issue, and a method has been widely adopted in which an anti-reflective coating (Bottom Anti-Reflective Coating, BARC) is provided as a resist underlayer film between the photoresist and the substrate to be processed for serving the function of preventing reflection.

Known examples of the anti-reflective coatings include: inorganic anti-reflective coatings such as titanium, titanium dioxide, titanium nitride, chromium oxide, carbon, and α-silicon; and organic anti-reflective coatings made from a light absorbing substance and a polymer compound. In forming films, the former requires systems such as a vacuum deposition system, a CVD system, and a sputtering system, whereas the latter requires no special system. In this respect, organic anti-reflective coatings are advantageous and a number of studies have been conducted.

ArF immersion lithography in which exposure is performed through water has been actively examined as a next-generation photolithography technique that replaces the photolithography technique using ArF excimer laser (193 nm). The photolithography techniques using light, however, have been approaching their limits. EUV lithography technique using EUV (at a wavelength of 13.5 nm, extreme ultraviolet) has been attracting attention as a new lithography technique after the ArF immersion lithography.

In the device fabrication process using EUV lithography, a substrate coated with an EUV resist is exposed by EUV radiation and developed to form a resist pattern. Here, in order to protect the EUV resist from contaminants or block undesired radiation such as UV light or DUV (deep ultraviolet) light, a method has been disclosed, in which the overlayer on the EUV resist includes a polymer including a group containing at least one of beryllium, boron, carbon, silicon, zirconium, niobium, and molybdenum (Patent Document 1 and Patent Document 2).

PRIOR ART DOCUMENTS

Patent Documents

Patent Document 1: Japanese Patent Application Publication No. 2004-348133 (JP 2004-348133 A)

Patent Document 2: Japanese Patent Application Publication No. 2008-198788 (JP 2008-198788 A)

SUMMARY OF THE INVENTION

Problem to be Solved by the Invention

The present invention provides a composition for forming an overlayer film for an EUV or electron beam resist for use in a lithography process, which does not intermix with a resist when used as an overlayer film on the resist, in particular, as an overlayer film on an EUV or electron beam resist, and which includes a sensitizer allowing exposure with high sensitivity even at a low exposure dose, in particular, during EUV exposure and electron beam exposure and can be developed with a developer after exposure.

Means for Solving the Problem

The present invention provides: as a first aspect, a resist overlayer film forming composition comprising: a benzene compound having at least one amino group;

as a second aspect, the resist overlayer film forming composition according to the first aspect, in which a resist is an EUV resist or an electron beam resist;

as a third aspect, the resist overlayer film forming composition according to the first aspect or the second aspect, in which the benzene compound has at least one amino group and at least one alkyl group;

as a fourth aspect, the resist overlayer film forming composition according to any one of the first to third aspects, in which the benzene compound has one or two amino groups and one to four alkyl groups;

as a fifth aspect, the resist overlayer film forming composition according to the first aspect or the second aspect, in which the benzene compound has one to three amino groups;

as a sixth aspect, the resist overlayer film forming composition according to the first aspect, in which the benzene compound is a compound of Formula (1):

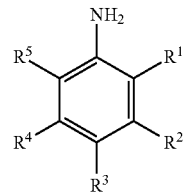

Formula (1)

(where $R^1$ to $R^5$ are independently a hydrogen atom, a $C_{1-10}$ alkyl group, or an amino group, and in a case where two or more groups of $R^1$ to $R^5$ are alkyl groups, the alkyl groups are optionally the same or different);

as a seventh aspect, the resist overlayer film forming composition according to the sixth aspect, in which among the $R^1$ to $R^5$, at least one group is a $C_{1-10}$ alkyl group;

as an eighth aspect, the resist overlayer film forming composition according to the sixth aspect, in which among the $R^1$ to $R^5$, at least one group is an amino group, and one to four groups are $C_{1-10}$ alkyl groups;

as a ninth aspect, the resist overlayer film forming composition according to the sixth aspect, in which among the $R^1$ to $R^5$, at least two groups are amino groups;

as a tenth aspect, the resist overlayer film forming composition according to any one of the sixth to ninth aspects, in which the alkyl group is a methyl group, an ethyl group, or an isopropyl group, and in a case where there are two or more of such alkyl groups, the alkyl groups are individually and arbitrarily selected from the group consisting of a methyl group, an ethyl group, and a propyl group;

as an eleventh aspect, the resist overlayer film forming composition according to any one of the first to tenth aspects, further comprising: a resin; and a solvent;

as a twelfth aspect, the resist overlayer film forming composition according to any one of the first to tenth aspects, further comprising: an acid compound;

as a thirteenth aspect, the resist overlayer film forming composition according to the twelfth aspect, in which the acid compound is a sulfonic acid compound or a sulfonic acid ester compound;

as a fourteenth aspect, the resist overlayer film forming composition according to the twelfth aspect, in which the acid compound is an iodonium salt-based acid generator or a sulfonium salt-based acid generator;

as a fifteenth aspect, a method for manufacturing a semiconductor device, the method comprising: forming a resist film on a substrate; applying the resist overlayer film forming composition as described in any one of the first to fourteenth aspects on the resist film and baking the composition to form a resist overlayer film; exposing the semiconductor substrate coated with the resist overlayer film and the resist film; and performing development after the exposing to remove the resist overlayer film and the resist film; and as a sixteenth aspect, the method for manufacturing a semiconductor device according to the fifteenth aspect, in which the exposing is performed with electron beams or EUV light (at a wavelength of 13.5 nm).

Effects of the Invention

The present invention is useful as a composition for forming an overlayer film on an EUV or electron beam resist, which does not intermix with a resist when used as an overlayer film on the resist, in particular, as an over layer film on an EUV or electron beam resist, and which includes a sensitizer allowing exposure with high sensitivity even at a low exposure dose, in particular, during EUV exposure and electron beam exposure.

MODES FOR CARRYING OUT THE INVENTION

The present invention is directed to a composition suitable for a resist overlayer film for use in a lithography process and is characterized by including a benzene compound having at least one amino group that functions as a sensitizer, that is, a basic substance such as aniline and aniline derivatives.

The mechanism of action of the aniline-based compound as a sensitizer can be considered as follows. First, when the resist overlayer film is irradiated with EUV light or electronic beams during exposure of the resist, an acid (H$^+$) is emitted from an acid compound, for example, an acid generator included in the film. Here, in the amino group of the aniline-based compound present in the resist overlayer film composition, the nitrogen atom has an unshared electron pair, with which a proton is likely to coordinate. The emitted acid component (H$^+$) is therefore temporarily trapped in the amino group of the aniline-based compound and stabilized to be efficiently supplied to the underlying resist. This is the possible reason why the sensitivity of the resist is improved. This mechanism suggests that the aniline-based compound serves the auxiliary function of generating an acid from the acid generator. The strength of basicity of amine has a close relationship with an electron donating group such as an alkyl group, and the presence of an alkyl group in the benzene ring is likely to cause proton coordination.

The benzene compound having an amino group that functions as a sensitizer is required to be highly effective in temporarily trapping the acid efficiently. The compound is also required to have a stable structure without being degraded during exposure because EUV light and electron beams are high-energy radiation having high energy intensity. For example, as a substitute for the benzene structure, when a biphenyl structure is used, the compound may be degraded by high energy radiation, and when an aromatic condensed ring structure is used, the compound may not provide sufficient proton coordination for the amino group due to nonlocalization of electrons.

The present invention will be described in details below.

The present invention provides a resist overlayer film forming composition that includes a benzene compound having at least one amino group. The resist preferably encompasses an EUV resist or an electron beam resist. Specifically, the present invention provides an EUV resist overlayer film forming composition that includes a benzene compound having at least one amino group. The present invention also provides an electron beam resist overlayer film forming composition that includes a benzene compound having at least one amino group.

The benzene compound having at least one amino group is a compound such as aniline and aniline derivatives as typical examples. Examples thereof include compounds of Formula (1).

The resist overlayer film forming composition can contain a resin and a solvent in addition to the benzene compound and can further include an acid compound, a cross-linking agent, a cross-linking catalyst, and a surfactant.

The resist overlayer film forming composition of the present invention has a solid content of 0.1% to 50% by mass and preferably 0.1% to 30% by mass. The solid content refers to the content of the resist overlayer film forming composition excluding a solvent component.

The benzene compound content in the resist overlayer film forming composition is not less than 0.01% by mass in the solid content, for example, 0.01% to 20% by mass, or 0.01% to 10% by mass, or 0.01% to 5% by mass.

The resin content in the resist overlayer film forming composition is not less than 20% by mass in the solid content, for example, 20% to 99.9% by mass, or 30% to 99.9% by mass, or 50% to 99.9% by mass, or 60% to 99.9% by mass.

The benzene compound preferably has at least one amino group and at least one alkyl group.

The benzene compound preferably has one or two amino groups and one to four alkyl groups.

The benzene compound preferably has one or two amino groups and two to four alkyl groups.

The benzene compound having one to three amino groups can be used.

The benzene compound is preferably a compound of Formula (1) above. In Formula (1), $R^1$ to $R^5$ are individually a hydrogen atom, a $C_{1-10}$ alkyl group, or an amino group. In a case where two or more groups of $R^1$ to $R^5$ are alkyl groups, the alkyl groups may be the same or different.

Examples of the alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Among these, linear or branched alkyl groups having carbon atom number of 1 to 5 are preferable. Preferable examples include a methyl group, an ethyl group, and an isopropyl group.

Examples of the benzene compound include compounds of Formula (1-1) to Formula (1-46):

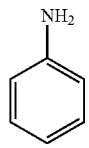

Formula (1-1)

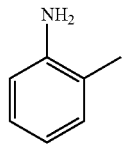

Formula (1-2)

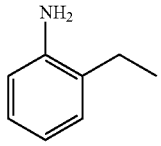

Formula (1-3)

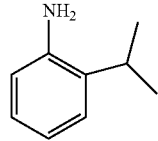

Formula (1-4)

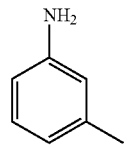

Formula (1-5)

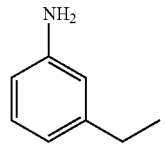

Formula (1-6)

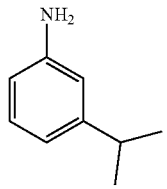

Formula (1-7)

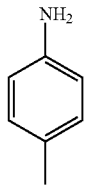

Formula (1-8)

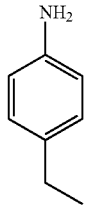

Formula (1-9)

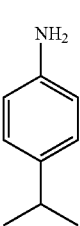

Formula (1-10)

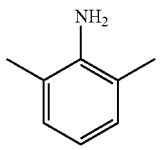

Formula (1-11)

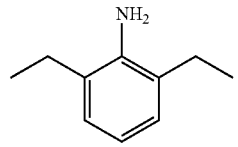

Formula (1-12)

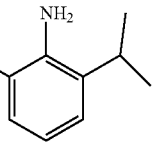

Formula (1-13)

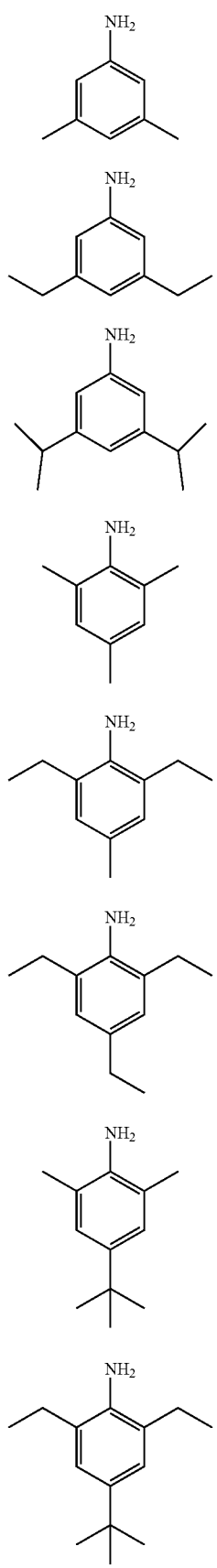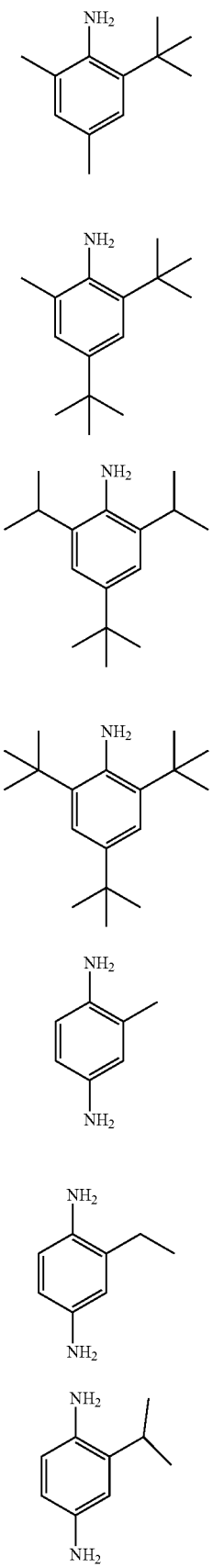

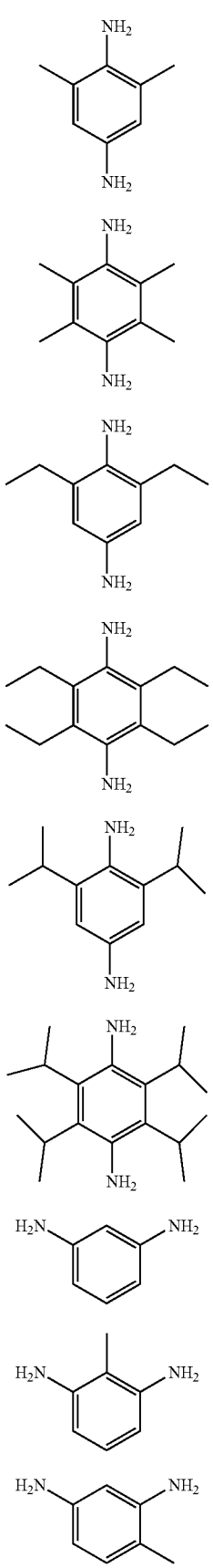
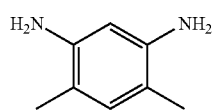
As the resin included in the resist overlayer film forming composition of the present invention, for example, condensation polymers and addition polymers can be used.

Examples of the addition polymers and the condensation polymers include polyesters, polystyrenes, polyimides, acrylic polymers, methacrylic polymers, polyvinyl ethers, phenol novolac, naphthol novolac, polyethers, polyamides, and polycarbonates.

In the case where an addition polymer is used as the resin, an addition-polymerizing monomer is used in its production. The addition polymer may be a homopolymer formed from a single type of addition-polymerizing monomer or may be a copolymer formed from two or more types of the monomers, as the structural unit.

Examples of the addition-polymerizing monomer include acrylic acid, methacrylic acid, acrylic ester compounds, methacrylic ester compounds, acrylamide compounds, methacrylamide compounds, vinyl compounds, styrene compounds, maleimide compounds, maleic anhydride, and acrylonitrile.

Examples of the acrylic ester compounds include methyl acrylate, ethyl acrylate, normal hexyl acrylate, iso-propyl acrylate, cyclohexyl acrylate, benzyl acrylate, phenyl acrylate, naphthyl acrylate, anthryl acrylate, anthryl methyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantly-acrylate, 5-acryloyloxy-6-hydroxynorbornene-2-carboxylic-6-lactone, 3-acryloxypropyl triethoxysilane, and glycidyl acrylate.

Examples of the methacrylic ester compounds include methyl methacrylate, ethyl methacrylate, normal hexyl methacrylate, isopropyl methacrylate, cyclohexyl methacrylate, benzyl methacrylate, phenyl methacrylate, naphthyl acrylate, anthryl methacrylate, anthryl methyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl-methacrylate, 5-methacryloyloxy-6-hydroxynorbornene-2-carboxylic-6-lactone, 3-methacryloxypropyl triethoxysilane, glycidyl methacrylate, 2-phenylethyl methacrylate, hydroxyphenyl methacrylate, and bromophenyl methacrylate.

Examples of the acrylamide compounds include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compounds include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compounds include vinyl alcohol, 2-hydroxyethyl vinyl ether, methyl vinyl ether, ethyl vinyl ether, benzyl vinyl ether, vinyl acetate, vinyltrimethoxysilane, 2-chloroethyl vinyl ether, 2-methoxyethyl vinyl ether, vinylnaphthalene, and vinylanthracene.

Examples of the styrene compounds include styrene, hydroxystyrene, chlorostyrene, bromostyrene, methoxystyrene, cyanostyrene, and acetylstyrene.

Examples of the maleimide compounds include maleimide, N-methylmaleimide, N-phenylmaleimide, N-cyclohexylmaleimide, N-benzylmaleimide, and N-hydroxyethylmaleimide.

In the case where a condensation polymer is used as the resin, examples of such a polymer include a condensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride.

Examples of the condensation polymer include polyesters, polyamides, and polyimides such as polypyromellitimide, poly(p-phenylene terephthalamide), polybutylene terephthalate, and polyethylene terephthalate.

Further examples of the condensation polymer include phenol novolac and naphthol novolac.

A polymer compound having a weight average molecular weight of for example, 1,000 to 1,000,000, or 1,000 to 300,000, or 1,000 to 200,000, or 1,000 to 100,000 can be used as the resin.

The resins above may be used singly or in a combination of two or more.

As the solvent included in the resist overlayer film forming composition of the present invention, alcoholic solvents can be preferably used. Examples of the alcoholic solvents include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol. These alcoholic solvents can be used singly or as a mixture.

Additional solvents below can be used in combination with the alcoholic solvents above. Examples of the additional solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more.

The ratio of these additional solvents contained to the alcoholic solvent may be 0.01% to 10.00% by mass.

The resist overlayer film forming composition of the present invention may further include an acid compound in order to match the acidity to that of the underlying resist in the lithography process.

As the acid compound, for example, a sulfonic acid compound or a sulfonic acid ester compound can be preferably used.

Examples of the sulfonic acid or sulfonic acid ester compound include acidic compounds such as p-toluenesulfonic acid, trifluoromethanesulfonic acid, pyridinium p-toluenesulfonate, and sulfosalicylic acid, and/or thermal acid generators such as benzoin tosylate and 2-nitrobenzyl tosylate.

Acid compounds such as salicylic acid, citric acid, benzoic acid, and hydroxybenzoic acid, and/or thermal acid generators such as 2,4,4,6-tetrabromocyclohexadienone can also be used as the acid compound.

The amount of these acid compounds blended is 0.02% to 10% by mass and preferably 0.04% to 5% by mass relative to 100% by mass of the total solid content of the resist overlayer film forming composition of the present invention.

The resist overlayer film forming composition of the present invention may include an acid generator that generates an acid by exposure light (for example, EUV radiation, electron beam radiation) in order to match the acidity to that of the underlying resist in the lithography process.

Preferred examples of the acid generator include: onium salt-based acid generators (for example, iodonium salt-based acid generators and sulfonium salt-based acid generators) such as bis(4-tert-butylphenyl)iodonium trifluoromethanesulfonate and triphenylsulfonium trifluoromethanesulfonate; halogen-containing compound-based acid generators such as phenyl-bis(trichloromethyl)-s-triazine; and sulfonic acid-based acid generators such as benzoin tosylate and N-hydroxysuccinimide trifluoromethanesulfonate.

The amount of the acid generator added is 0.02% to 10% by mass and preferably 0.04% to 5% by mass relative to 100% by mass of the total solid content of the resist overlayer film forming composition of the present invention.

The resist overlayer film forming composition of the present invention may further include a rheology control agent, an adhesion assistant, a surfactant, or other additives as necessary in addition to the above components.

The rheology control agent is added in order to mainly improve flowability of the resist overlayer film forming composition. Specific examples include: phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate.

The ratio of these rheology control agents blended is generally less than 30% by mass with respect to 100% by mass of the total composition of the resist overlayer film forming composition.

The resist overlayer film forming composition of the present invention may further include a surfactant in order not to generate pinholes, striations, and other defects and to further improve the coating properties against surface irregularities. Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP EF301, EF303, and EF352 (manufactured by Tochem Products (at present: Mitsubishi Materials Electronic Chemicals Co., Ltd.)), MEGAFAC F171 and F173 (manufactured by DIC Corporation), Fluorad FC430 and FC431 (manufactured by Sumitomo 3M Ltd.), Asahiguard AG710, and Surflon S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.).

The amount of these surfactants blended is generally not more than 0.2% by mass and preferably not more than 0.1% by mass relative to 100% by mass of the total composition of the resist overlayer film forming composition of the present invention. These surfactants may be added singly or in combination of two or more.

Examples of the resist applied underneath the resist overlayer film of the present invention include photoresists, electron beam resists, and EUV resists.

The photoresists may be those sensitive to light for use in KrF or ArF exposure and may be either negative photoresists or positive photoresists.

Specific examples include: a positive photoresist including a novolac resin and 1,2-naphthoquinone diazide sulfonic acid ester; a chemically amplified photoresist including a binder having a group that is degraded by an acid to increase the alkali dissolution rate, and a photo acid generator; a chemically amplified photoresist including a low molecular compound that is degraded by an acid to increase the alkali dissolution rate of the photoresist, an alkali soluble binder, and a photo acid generator; and a chemically amplified photoresist including a binder having a group that is degraded by an acid to increase the alkali dissolution rate, a low molecular compound that is degraded by an acid to increase the alkali dissolution rate of the photoresist, and a photo acid generator.

Examples include the trade name APEX-E manufactured by Shipley, the trade name PAR710 manufactured by Sumitomo Chemical Company, Limited, and the trade name SEPR430 manufactured by Shin-Etsu Chemical Co., Ltd. Other examples include fluorine atom-containing polymer-based photoresists as listed in Proc. SPIE, Vol. 3999, 330-334 (2000), Proc. SPIE, Vol. 3999, 357-364 (2000), and Proc. SPIE, Vol. 3999, 365-374 (2000).

The electron beam resists used may be either negative or positive.

Examples include: a chemically amplified resist including an acid generator and a binder having a group that is degraded by an acid to change the alkali dissolution rate; a chemically amplified resist including an alkali soluble binder, an acid generator, and a low molecular compound that is degraded by an acid to change the alkali dissolution rate of the resist; a chemically amplified resist including an acid generator, a binder having a group that is degraded by an acid to change the alkali dissolution rate, and a low molecular compound that is degraded by an acid to change the alkali dissolution rate of the resist; a non-chemically amplified resist including a binder having a group that is degraded by electron beams to change the alkali dissolution rate; and a non-chemically amplified resist including a binder having a moiety that is cleaved by electron beams to change the alkali dissolution rate.

In the case where these electron beam resists are used, resist patterns can be formed in the same manner as in the case where photoresists are used with KrF, ArF light as a radiation source.

In the present invention, EUV resists can be used. The EUV resist applied underneath the EUV resist overlayer film in the present invention may be either negative or positive.

Examples include: a chemically amplified resist including an acid generator and a binder having a group that is degraded by an acid to change the alkali dissolution rate; a chemically amplified resist including an alkali soluble binder, an acid generator, and a low molecular compound that is degraded by an acid to change the alkali dissolution rate of the resist; a chemically amplified resist including an acid generator, a binder having a group that is degraded by an acid to change the alkali dissolution rate, and a low molecular compound that is degraded by an acid to change the alkali dissolution rate of the resist; a non-chemically amplified resist including a binder having a group that is degraded by EUV to change the alkali dissolution rate; and a non-chemically amplified resist including a binder having a moiety that is cleaved by EUV to change the alkali dissolution rate. In the case where these EUV resists are used, resist patterns can be formed in the same manner as in the case where resists are used with electron beams as a radiation source.

Examples of the developer for a positive resist having a resist overlayer film formed with the resist overlayer film forming composition of the present invention include aqueous solutions of alkalis including: inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. The aqueous solutions of alkalis may contain alcohols such as isopropyl alcohol or a surfactant such as a nonionic surfactant in an appropriate amount to be used as the developer. Among these developers, quaternary ammonium salts are preferred, and tetramethylammonium hydroxide and choline are more preferred.

In the present invention, a semiconductor device can be manufactured by forming a resist film on a substrate having a target film onto a transfer pattern is to be formed, with or without a resist underlayer film; applying the resist overlayer film forming composition onto the resist film and baking the composition to form a resist overlayer film; exposing the semiconductor substrate coated with the resist overlayer film and the resist film; and performing development after exposure to remove the resist overlayer film and the resist film.

The exposure is preferably performed with electron beams or EUV light (at a wavelength of 13.5 nm).

A semiconductor device to which the resist overlayer film forming composition of the present invention is applied has a target film on which a pattern is to be transferred, a resist film, and a resist overlayer film, which are formed on a substrate in this order.

The resist overlayer film can reduce adverse effects caused by the underlying substrate or exposure light such as EUV, thereby forming a good resist pattern in a straight shape and providing a sufficient margin for the radiation dose. The resist overlayer film can have a high wet etching rate equivalent to that of the underlying resist film, so that a resist pattern can be easily transferred to the underlying target film through a wet etching process.

EXAMPLES

The present invention will be described in details below with Synthesis Examples and Examples. The present invention, however, is not limited to the description below.

The weight average molecular weight shown in Synthesis Example 1 and Synthesis Example 2 below in this specification is the measurement result obtained by Gel Permeation Chromatography (hereinafter abbreviated as GPC in this specification). A GPC system manufactured by TOSOH CORPORATION was used in the measurement, and the measurement conditions are as follows. The degree of distribution shown in Synthesis Examples below in this specification is calculated from the measured weight average molecular weight and the number average molecular weight.

GPC column: Shodex [trade name], Asahipak [trade name] (SHOWA DENKO K. K.)
Column temperature: 40° C.
Solvent: N,N-dimethylformamide (DMF)
Flow rate: 0.6 ml/min
Standard sample: polystyrene (manufactured by TOSOH CORPORATION)
Detector: RI detector (manufactured by TOSOH CORPORATION, RI-8020)

Synthesis Example 1

A vinylnaphthalene-containing resin (2-vinylnaphthalene:hydroxy styrene:methacrylic acid=50:20:30 in mass ratio) was produced by radial polymerization. The polymer solution did not develop turbidity or other problems even when cooled to room temperature, and its solubility in 4-methyl-2-pentanol was good. The GPC analysis showed that the polymer in the resulting solution had a weight average molecular weight of 5,800 in terms of standard polystyrene.

Synthesis Example 2

A naphthol novolac resin (a novolac resin obtained through a reaction with formaldehyde with a molar ratio of 1-naphthol:phenol=50:50) was synthesized. The polymer solution did not develop turbidity or other problems even when cooled to room temperature, and its solubility in 4-methyl-2-pentanol was good. The GPC analysis showed that the polymer in the resulting solution had a weight average molecular weight of 3,200 in terms of standard polystyrene.

Example 1

1 g of the polymer obtained in Synthesis Example 1 was mixed with 0.01 g of 2,6-diisopropylaniline and dissolved in 99 g of 4-methyl-2-pentanol. The resultant product was thereafter filtered through a polyethylene microfilter having a pore diameter of 0.05 μm to produce a resist overlayer film forming composition for lithography.

Example 2

1 g of the polymer obtained in Synthesis Example 1 was mixed with 0.01 g of 2,3,5,6-tetramethyl-1,4-pheynylenediamine and dissolved in 99 g of 4-methyl-2-pentanol. The resultant product was thereafter filtered through a polyethylene microfilter having a pore diameter of 0.05 μm to produce a resist overlayer film forming composition for lithography.

Example 3

1 g of the polymer obtained in Synthesis Example 2 was mixed with 0.01 g of 2,6-diisopropylaniline and dissolved in 99 g of 4-methyl-2-pentanol. The resultant product was thereafter filtered through a polyethylene microfilter having a pore diameter of 0.05 μm to produce a resist overlayer film forming composition for lithography.

Example 4

1 g of the polymer obtained in Synthesis Example 2 was mixed with 0.01 g of 2,3,5,6-tetramethyl-1,4-pheynylenediamine and dissolved in 99 g of 4-methyl-2-pentanol. The resultant product was thereafter filtered through a polyethylene microfilter having a pore diameter of 0.05 μm to produce a resist overlayer film faulting composition for lithography.

Comparative Example 1

1 g of the polymer obtained in Synthesis Example 1 was mixed with 0.01 g of o-dianisidine and dissolved in 99 g of 4-methyl-2-pentanol. The resultant product was thereafter filtered through a polyethylene microfilter having a pore diameter of 0.05 μm to produce a resist overlayer film forming composition for lithography.

Comparative Example 2

1 g of the polymer obtained in Synthesis Example 1 was mixed with 0.01 g of 3,3',5,5'-tetramethylbenzidine and dissolved in 99 g of 4-methyl-2-pentanol. The resultant product was thereafter filtered through a polyethylene microfilter having a pore diameter of 0.05 μm to produce a resist overlayer film forming composition for lithography.

Comparative Example 3

1 g of the polymer obtained in Synthesis Example 2 was mixed with 0.01 g of o-dianisidine and dissolved in 99 g of 4-methyl-2-pentanol. The resultant product was thereafter filtered through a polyethylene microfilter having a pore diameter of 0.05 μm to produce a resist overlayer film forming composition for lithography.

Comparative Example 4

1 g of the polymer obtained in Synthesis Example 2 was mixed with 0.01 g of 3,3',5,5'-tetramethylbenzidine and dissolved in 99 g of 4-methyl-2-pentanol. The resultant product was thereafter filtered through a polyethylene microfilter having a pore diameter of 0.05 μm to produce a resist overlayer film forming composition for lithography.

(Determination of Lithography Performance)

A resist solution (acrylic resin-based resist) was applied on a silicon wafer using a spinner to form a resist film. The resist overlayer film forming compositions prepared in Examples 1, 2, 3, and 4 and Comparative Examples 1, 2, 3, and 4 were each applied on the silicon wafer using a spinner. The silicon wafer was placed on a hot plate, baked at 100° C. for 90 seconds to form a resist overlayer film (film thickness of 0.03 μm). The sensitivity (hereinafter called the pattern formation sensitivity) at which a line-and-space of 50 nm was formed on the resist film was measured using an electron beam lithography system ELS-7500 manufactured by ELIONIX INC.

The sensitivity of a resist film not having a resist overlayer film was also measured in the same manner (Comparative Example 5)

Table 1 shows the obtained results.

The pattern formation sensitivities of the resist overlayer films obtained from the resist overlayer film forming compositions in Examples 1 to 4 are greater than the pattern formation sensitivity of the resist alone without a resist overlayer film (Comparative Example 5) and is also greater than the resist pattern formation sensitivities of the resist overlayer films obtained from the resist overlayer film forming compositions in Comparative Examples 1, 2, 3, and 4.

TABLE 1

|  | Sensitivity (μC/cm$^2$) |
|---|---|
| Example 1 | 48 |
| Example 2 | 40 |
| Example 3 | 46 |
| Example 4 | 38 |
| Comparative Example 1 | 78 |
| Comparative Example 2 | 64 |
| Comparative Example 3 | 76 |
| Comparative Example 4 | 62 |
| Comparative Example 5 | 70 |

INDUSTRIAL APPLICABILITY

The present invention provides a composition for forming an overlayer film for an EUV or electron beam resist for use in a lithography process, which does not intermix with a resist when used as an overlayer film on the resist, in particular, as an overlayer film on an EUV or electron beam resist, and which includes a sensitizer allowing exposure with high sensitivity even at a low exposure dose, in particular, during EUV exposure and electron beam exposure and can be developed with a developer after exposure.

The invention claimed is:

1. A resist overlayer film forming composition comprising: a benzene compound of Formula (1):

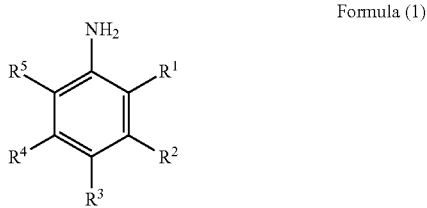

where:
R$^1$ to R$^5$ are independently a hydrogen atom, a C$_{1-10}$ alkyl group, or an amino group, and
if two or more groups of R$^1$ to R$^5$ are alkyl groups, the alkyl groups are the same or different;
wherein the resist is an EUV resist or an electron beam resist.

2. The resist overlayer film forming composition according to claim 1, wherein among the R$^1$ to R$^5$, at least one group is a C$_{1-10}$ alkyl group.

3. The resist overlayer film forming composition according to claim 1, wherein among the R$^1$ to R$^5$, at least one group is an amino group, and one to four groups are C$_{1-10}$ alkyl groups.

4. The resist overlayer film forming composition according to claim 1, wherein among the R$^1$ to R$^5$, at least two groups are amino groups.

5. The resist overlayer film forming composition according to claim 1, wherein:
the alkyl group is a methyl group, an ethyl group, or an isopropyl group, and
if there are two or more of the alkyl groups, the alkyl groups are independently selected from the group consisting of a methyl group, an ethyl group, and a propyl group.

6. The resist overlayer film forming composition according to claim 1, further comprising:
a resin; and
a solvent.

7. The resist overlayer film forming composition according to claim 1, further comprising an acid compound.

8. The resist overlayer film forming composition according to claim 7, wherein the acid compound is a sulfonic acid compound or a sulfonic acid ester compound.

9. The resist overlayer film forming composition according to claim 7, wherein the acid compound is an iodonium salt-based acid generator or a sulfonium salt-based acid generator.

10. A method for manufacturing a semiconductor device, the method comprising:
    forming an EUV or an electron beam resist film on a substrate;
    applying the resist overlayer film forming composition as claimed in claim 1 on the resist film and baking the composition to form a resist overlayer film;
    exposing the semiconductor substrate coated with the resist overlayer film and the resist film; and
    performing development after the exposing to remove the resist overlayer film and the resist film.

11. The method for manufacturing a semiconductor device according to claim 10, wherein the exposing is performed with electron beams or EUV light at a wavelength of 13.5 nm.

\* \* \* \* \*